(12) United States Patent
Hu et al.

(10) Patent No.: US 8,605,501 B2
(45) Date of Patent: Dec. 10, 2013

(54) SYSTEM AND METHOD FOR DETERMINING DATA DEPENDENT NOISE CALCULATION FOR A FLASH CHANNEL

(75) Inventors: Xinde Hu, San Diego, CA (US); Richard D. Barndt, San Diego, CA (US); Anthony D. Weathers, San Diego, CA (US)

(73) Assignee: STEC, Inc., Santa Ana, CA (US)

( * ) Notice: Subject to any disclaimer, the term of this patent is extended or adjusted under 35 U.S.C. 154(b) by 331 days.

(21) Appl. No.: 13/176,727

(22) Filed: Jul. 5, 2011

(65) Prior Publication Data

US 2012/0236651 A1  Sep. 20, 2012

Related U.S. Application Data

(60) Provisional application No. 61/361,891, filed on Jul. 6, 2010.

(51) Int. Cl.
*G11C 11/34* (2006.01)
(52) U.S. Cl.
USPC ............................ 365/185.03; 365/185.18

(58) Field of Classification Search
USPC ........................................ 365/185.03, 185.18
See application file for complete search history.

(56) References Cited

U.S. PATENT DOCUMENTS 7,558,109 B2 *   7/2009   Brandman et al. ....... 365/185.03

* cited by examiner

*Primary Examiner* — Son Dinh
*Assistant Examiner* — Nam Nguyen
(74) *Attorney, Agent, or Firm* — McDermott Will & Emery LLP

(57) ABSTRACT

Disclosed is an system and method for determining a probability that a memory cell was programmed to a certain input level. An output level is received from a memory cell and a probability is determined that the output level corresponds to each of a plurality of programming levels. Each probability is determined as a function of the output level, a mean value of a distribution corresponding to the programming level, and a variance from the mean value with the variance being determined by a relative position of the output level with respect to the mean value. A probability value is generated as a function of the plurality of determined probabilities and then provided for use at a demodulator.

24 Claims, 4 Drawing Sheets

SYSTEM AND METHOD FOR DETERMINING DATA DEPENDENT NOISE CALCULATION FOR A FLASH CHANNEL

CROSS-REFERENCES TO RELATED APPLICATIONS

This application claims priority from U.S. Provisional Application No. 61/361,891, filed Jul. 6, 2010, which is incorporated herein by reference in its entirety.

TECHNICAL FIELD

The subject technology relates generally to memory devices and in particular multi-level cell flash memory devices.

BACKGROUND

Lower priced Solid State Drives (SSD) are typically manufactured using multi-level cell (MLC) flash memory for increased data capacity, but MLC is less reliable than single-level cell (SLC) flash memory. Consumer SSD manufacturers have mitigated such problems by employing interleaving and/or providing excess capacity in conjunction with wear-leveling algorithms. MLC flash endurance, however, has not been proven acceptable for enterprise SSD applications. Even with the increased data capacity of MLC, using MLC in enterprise applications becomes more expensive because of its disproportionately large decrease in program/erase (P/E) cycles over time due to increased (wear causing) stresses required to read, program and erase the flash, causing a gradual degradation in endurance.

Conventional trellis coded modulation (TCM) has been used to improve error correcting performance to extend the life memory devices, including flash memory. TCM and other demapping techniques use Euclidean distance as a measurement for branch metrics and/or cumulative distances. The reason Euclidean distances have been used is that the noise in the channel has been viewed as a pure additive White Gaussian noise that obeys a normal distribution closely, and this noise is not dependent upon the signal level used to program the individual memory cells. Thus, in current modulation schemes, including those used with flash-channel devices, the programmed levels of the cells are presumed to take on symmetrical, normal distributions.

SUMMARY

A system and method for determining a probability that a memory cell was programmed to a certain input level is disclosed. According to one aspect, an output level is received from a memory cell. The output level may be one of a plurality of output levels received from a read operation on a block or page of memory cells. For each of a plurality of programming levels, a probability may be determined that the programming level corresponds to the output level, the probability being determined as a function of the output level, a mean value of a distribution corresponding to the programming level, and a variance from the mean value. A probability value may be generated from a function of the plurality of determined probabilities, and then provided for use at a demodulator. In some aspects, the variance is determined by a relative position of the output level with respect to the mean value. In other aspects, if, for each of the plurality of programming levels, the distribution corresponding to the programming level is above the output level then the variance is below the mean value, and, if the distribution is below the output level then the variance is above the mean value.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Noise in a flash channel memory cell is dependent upon which level (for example, cell voltage) the cell is being programmed to. For example, different programming levels may take on different distributions and have different noise variances, and for MLC, the distributions may not be evenly spaced. Instead of directly applying a detection scheme such as Euclidean distance, the subject technology determines (for example, calculates) distances based on an estimated noise for each programmed level to further improve system error correcting performance.

The term "variance" as used herein may include, but is not intended to be limited to, a measure of how far a set of values are spread out from each other. The term may be used interchangeably with and/or include a deviation, variation, or dispersion from an average, mean, or expected value. In one aspect, a probability based on a variance may include the probability being based on a standard deviation (for example, the square root of a variance).

Figure 1:
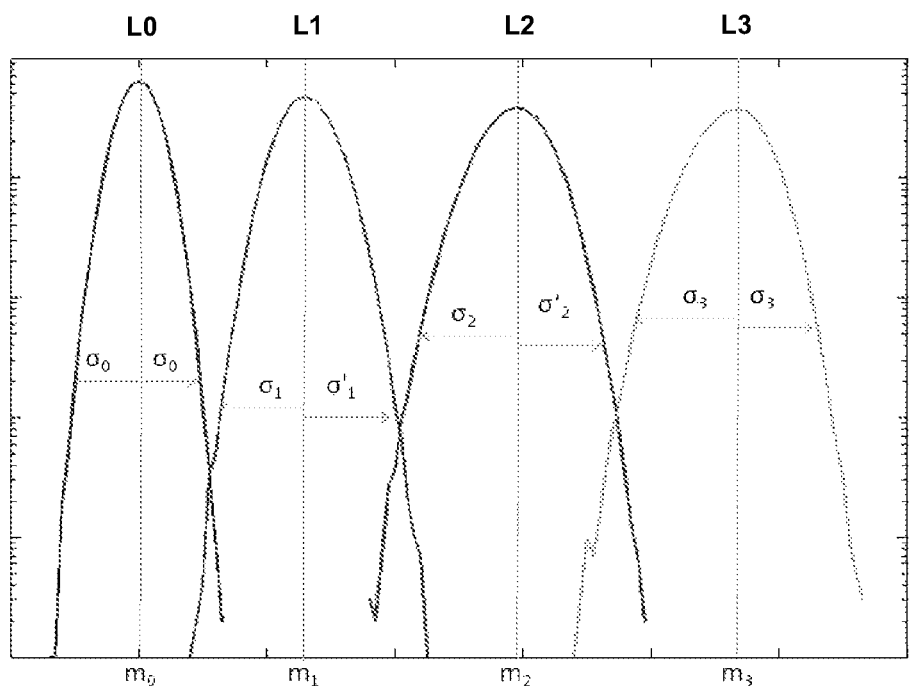
FIG. 1 is an exemplary graph diagram of four possible distributions of cell programming levels for a group of memory cells in a multi-level cell flash memory according to one aspect of the subject technology.

FIG. 1 is an exemplary graph diagram of four possible distributions of cell programming levels for a group of memory cells in a MLC flash memory according to one aspect of the subject technology. A MLC NAND cell is capable of storing four levels of charge per cell: an erased level L0, and programmed levels L1, L2, and L3. These four states yield two logical bits of information per cell, the Most Significant Bit (MSB) and Least Significant Bit (LSB). In a group of cells, these two bits may make up corresponding MSB and LSB pages of a memory block. In some aspects, a NAND memory block is programmed one page at a time using an Incremental Step Programming Procedure (ISSP) and erased using a similar Incremental Step Erase Procedure (ISEP). The memory cells that are to be programmed may be selected at the bit line, and a "page operation" may be performed to apply a voltage at the gates of each cell in the memory page. A corresponding selection at the bit lines creates a voltage potential in the selected group of memory cells where the LSB is selected to be different (for example, binary 10 or 00) than the erased L0 distribution state (for example, binary 11).

During programming of the cell, the threshold voltage $V_T$ in the floating gates of the selected group of cells is increased to create a LSB distribution. Then, in a similar manner, during a MSB page program operation, the ISPP is applied to create an L1 distribution from the erased L0 distribution (for example, binary 01), or, an L2 distribution (for example, binary 00) or L3 distribution (for example, binary 10) from the previously programmed LSB distribution. In some aspects, all of the above distributions are created from L0 distribution by applying a series of voltage pulses to the memory cells of the page which is being programmed.

As a flash memory is cycled (that is, programmed and erased repeatedly), its physical qualities change. For example, the repeated placement and removal of electrons on the floating gate during programming and erase operations, respectively, causes some excess electrons to be trapped in the device, and, when one or multiple cells are programmed, electrons may leak into neighboring cells after prolonged stress due to the voltages at the gates of neighboring cells. This noise may cause the threshold voltages of these memory cells to eventually take values that are different (higher or lower) than expected values, and, as the cells age, the distributions of the programmed voltages may become wider and/or drift. When the $V_T$ of some of the cells in the distributions begin to cross higher or lower read levels, the likelihood that a read operation will produce an error increases.

When using 2-bit MLC flash, a read back signal can be modeled as an asymmetric Gaussian distributed signal. As described previously, the mean of the distributions (for example, $m_1$, $m_2$, $m_3$, $m_4$) and the variances of the distributions (for example, $\sigma_0$, $\sigma_0'$, $\sigma_1$, $\sigma_1'$, $\sigma_2$, $\sigma_2'$, $\sigma_3$, $\sigma_2'$, $\sigma_3$, $\sigma_3'$) are dependent on not only the written level (for example, different programmed levels having different variances), but also on the endurance and retention of the flash cell. The longer the endurance cycle is, the larger the variance may become. In addition, the two sides of each programmed levels may not have the same variance (for example, on each side). As shown by the depicted example, the subject technology may use variances of L2 (for example, $\sigma_2$ and $\sigma_2'$ respectively for L2) that are different than those used for L1.

Figure 2:
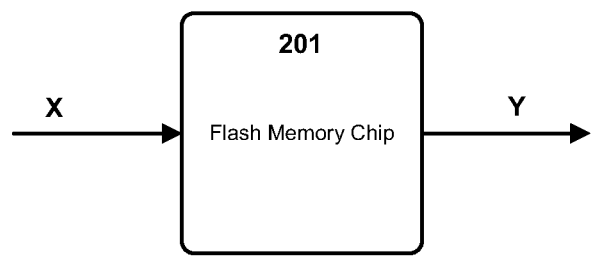
FIG. 2 is a block diagram illustrating programming and reading from a multi-level cell flash memory according to one aspect of the subject technology.

FIG. 2 is a block diagram illustrating programming and reading from a multi-level cell flash memory according to one aspect of the subject technology. As described previously, a MLC flash memory cell 201 may be programmed using a program (write) voltage level X (for example, 0, 1, 2, 3) to create a 2-bit binary value. On performing a read of the cell, due to changing conditions of the memory cell, the perceived output level Y may not take on the same or equivalent value X. In this regard, on receiving the output level Y read from the memory cell, the subject technology may determine, for each programming level $x_0$, $x_1$, $x_2$, and $x_3$, a probability that the memory cell was programmed to the respective programming level. This set of probability values may then be arranged into a single probability and/or forwarded along with the output level Y (as bits) to a demodulator to be used in conjunction with a modulation scheme (for example, correcting bits used in trellis coded modulation). In accordance with some aspects of the subject technology, the value representative of the program and/or output level may be an actual voltage level (for example, 0.3 V, 2.5 V, or the like) or a fixed level (for example, 0, 2, 1, 3) corresponding to the voltage level made available by the flash memory.

Sample distributions L0, L1, L2, and L3 corresponding to programming levels $x_0$, $x_1$, $x_2$, and $x_3$ may be generated based on test and/or simulation data and stored in memory. When an output level Y is received, a Noise Calculation Unit (see FIG. 3) may access the stored data and determine a probability that the output level Y corresponds to each of these possible programming levels. Each probability may be determined as a function of the output level, a mean value of the distribution corresponding to the programming level, and a variance from the mean value, all readily determinable from the stored data. Since the variations on either side may not be equal, each probability may be determined using the variance from only one side of the distribution:

$$P = \frac{1}{\sqrt{2\pi\sigma^2}} \exp\left(-\frac{(y-m)^2}{2\sigma^2}\right) \tag{1}$$

where variance $\sigma$ is the standard deviation of cell levels in one direction from the mean value m of a distribution of cell levels corresponding to the particular programming level.

The probability that program value X is in a different distribution may include calculating the probability of the other distributions. The standard deviation above or below the mean of the distribution may be used in the calculation, depending on the relative position of output level Y with respect to the mean the distribution. For example, if output level Y corresponds to a value within the standard deviation above the mean of the L1 distribution then σ' of L1 (see FIG. 1) may be used in the algorithm, and (lower deviation) σ of L1 ignored. Accordingly, σ' of L0 may be used to determine the probability that output level Y is in distribution L0, and σ of L2 may be used to determine the probability that output level Y is in distribution L2. Similarly, σ of L3 may be used to determine the probability that output level Y is in distribution L3.

Moreover, an algorithm for determining a probability that a memory cell was programmed to a certain input level may presume that the standard deviation determined on each side of distributions L1 and L2 vary and may be different from each other, while the standard deviation determined on each side of distributions L0 and L3 may be presumed to be symmetric. In this regard, the algorithm may be reduced to six terms: each term representing the probability that input level X corresponds to one side of a mean. The algorithm may further use an impulse function δ(x), and sign functions +sign (−y+m) and +sign(y−m), to indicate the sides of Gaussian distribution used to determine the probability that the memory cell was programmed at a given programming level.

$$\max_x P(x \mid y) = \max_x [P(y \mid x) P(x) / P(y)] \quad (2)$$

$$= \max_x P(y \mid x)$$

$$= \max_X \left\{ \delta(x - x_0) \frac{1}{\sqrt{2\pi\sigma_0^2}} \exp\left(-\frac{(y - m_0)^2}{2\sigma_0^2}\right) + \right.$$

$$\text{sign}(-y + m_1)\delta(x - x_1) \frac{1}{\sqrt{2\pi\sigma_1^2}} \exp\left(-\frac{(y - m_1)^2}{2\sigma_1^2}\right) +$$

$$\text{sign}(y - m_1)\delta(x - x_1) \frac{1}{\sqrt{2\pi\sigma_1'^2}} \exp\left(-\frac{(y - m_1)^2}{2\sigma_1'^2}\right) +$$

$$\text{sign}(-y + m_2)\delta(x - x_2) \frac{1}{\sqrt{2\pi\sigma_2^2}} \exp\left(-\frac{(y - m_2)^2}{2\sigma_2^2}\right) +$$

$$\text{sign}(y - m_2)\delta(x - x_2) \frac{1}{\sqrt{2\pi\sigma_2'^2}} \exp\left(-\frac{(y - m_2)^2}{2\sigma_2'^2}\right) +$$

$$\left. \delta(x - x_3) \frac{1}{\sqrt{2\pi\sigma_3^2}} \exp\left(-\frac{(y - m_3)^2}{2\sigma_3^2}\right) \right\}$$

Using the above algorithm, represented as a conditional probability definition, one may find the most likely program level for a given read level. The algorithm determines the maximum likelihood that a given X that would result in output value Y. Since all four levels are evenly used, P(x) may be omitted from the algorithm and P(y) considered a constant since input level Y is a known value. A maximum value is chosen over all possible input sequences, and used in the algorithm to generate Gaussian probabilities of seeing the output Y given the values that correspond to each possible X. In this regard, it is not necessary to determine the precise value of X, only that it is at one of a discrete number of programming levels (in this example, four). Accordingly, the X that corresponds to the maximum value with respect to all possible input sequences of the output may be determined.

As shown by the above calculations, the probability of X corresponding to a given programming level depends on, in part, output value Y. For each of the plurality of programming levels, if the distribution corresponding to the programming level is above the output level then the variance used in the algorithm may be below the mean value, and if the distribution is below the output level then the variance used may be above the mean value. The impulse and sign functions may guarantee that, for each X value and Y value, only one term will be calculated and compared. For example, if $X=x_1$, meaning determining the probability of input level X being L1, and Y is between L1 and L2, then only the following term will be calculated and eventually compared to other candidates.

$$\text{sign}(y - m_1)\delta(x - x_1) \frac{1}{\sqrt{2\pi\sigma_1'^2}} \exp\left(-\frac{(y - m_1)^2}{2\sigma_1'^2}\right) \quad (3)$$

In a further aspect, sample distributions L0, L1, L2, and L3 (corresponding to programming levels $x_0$, $x_1$, $x_2$, and $x_3$) may be generated for, and indexed by, certain memory conditions. For example, since cell distributions change over the life of flash memory, sample distributions, including their associated mean values and variances, may be generated and stored in a memory (see, for example, FIG. 4) based on cycle count (for example, program/erase cycles). In this regard, different distributions may be generated and stored at predetermined cycle intervals (for example, at 20k, 50k, and 100k program/erase cycles, or every 20k cycles) for use in determining the effect of changing distributions over the life of the flash memory. In another aspect, distributions may be generated, stored, and/or updated based on retention time. For example, the distributions may be adjusted for a block whose data was retained for more than a predetermined period of time (for example, three months). The subject technology may then access the stored values to determine updated mean values and variances for use in the previously described algorithm when a predetermined cycle time and/or retention time associated with the memory cell (for example, with the memory block or page) is reached or exceeded.

For each probability calculation, all three boundaries possibilities (for example, between L0 and L1, L1 and L2, and L2 and L3) are presumed to be different and/or changing. Accordingly, the previously described algorithm may be adjusted based on the distance of a perceived output value Y from a possible program value X, the differences between the distributions of each programming level, shifts in the distributions over the life of the memory cells, and the like. Based on test results, if output value Y=1 and program value X was actually 0 then the calculated probability will likely be very low, since we know that L0 is very reliable. This is contrary to situations where program value X=1, and output value Y=0, which has been determined through test results to be more likely to occur. Therefore, as described previously, the deviations on each side of L0 and L3 may be considered to be symmetric. One skilled in the art would recognize, however, that the algorithm may be adjusted to accommodate different standards of deviation for each side of distributions L0 and L3 in the same manner.

In some aspects, the probability values generated for each programming level may be combined and or used to generate one or more log domain probability values (for example, a log likelihood ratio). For example, one or more bits may be generated to represent a log domain probability for the least significant bit (LSB) of the MLC cell, and another one or more bits generated to represent a log domain probability of the most significant bit (MSB) of the MLC cell. In one aspect, the log domain probability of the LSB may include a ratio of the sum of the first and second probability to the sum of the third and fourth probability. Similarly, the log domain probability of the MSB may include a ratio of the sum of the first and third probability to the sum of the second and fourth probability. These log domain probabilities may then be used in conjunction with a demodulator to determine whether the actual bits received from the flash memory are accurate. The demodulated bits may then be forwarded to a decoder for error correction.

Figure 3:
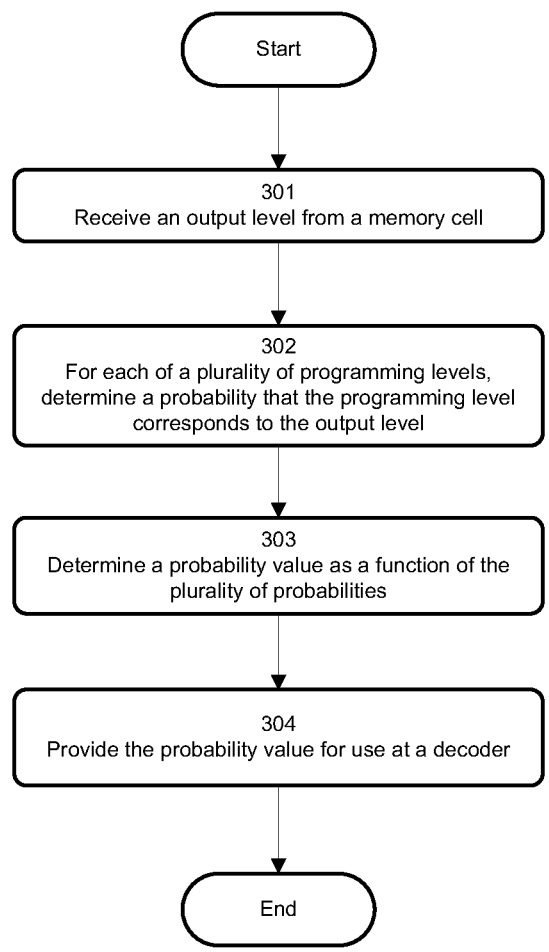
FIG. 3 is a flowchart illustrating a method of determining a probability that a memory cell was programmed using a certain input level according to one aspect of the subject technology.

FIG. 3 is a flowchart illustrating a method of determining a probability that a memory cell was programmed to a certain input level according to one aspect of the subject technology. In a first process 301, an output level is received from a memory cell. The output level may be one of a plurality of output levels received from a read operation on a block or page of memory cells. In a second process 302, for each of a plurality of programming levels, a probability is determined that the programming level corresponds to the output level. In this regard, the probability is determined as a function of the output level, a mean value of a distribution corresponding to the programming level, and a variance from the mean value. In one aspect, the variance is determined by a relative position of the output level with respect to the mean value. In other aspects, if, for each of the plurality of programming levels, the distribution corresponding to the programming level is above the output level then the variance is below the mean value, and, if the distribution is below the output level then the variance is above the mean value. In a third process 303, a probability value is generated from a function of the plurality of probabilities, and then, in a fourth process 304, the probability value is provided for use at a demodulator.

Figure 4:
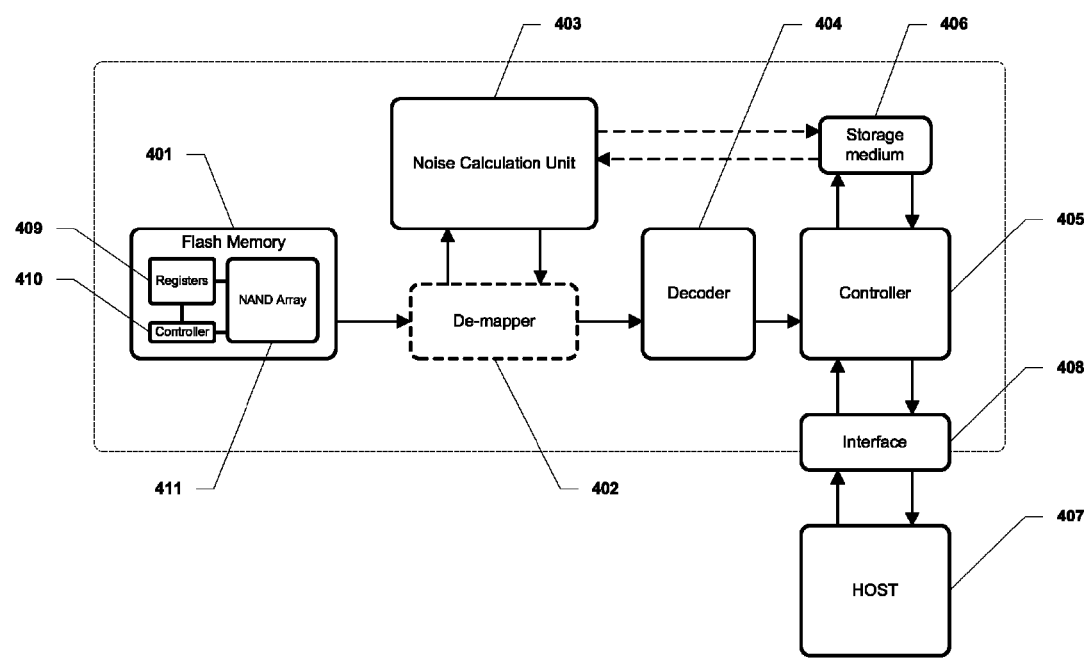
FIG. 4 is a block diagram illustrating components of a flash memory storage system, including a noise calculation unit, according to one aspect of the subject technology.

FIG. 4 is a block diagram illustrating components of a flash memory storage system, including a noise calculation unit, according to one aspect of the subject technology. A flash memory storage system 400 (for example, a solid state drive) may include a flash memory 401, a memory demapper 402 (a demodulator) and noise calculation unit 403, an ECC decoder 404 (for example, LDPC code or BCH code), and a data storage controller 405. Noise calculation unit 403 and/or controller 405 may use a storage medium 406 for temporary storage of data and information. Demapper 402 is generally used in page-based systems (also called a detector for level-based system like TCM) to modulate/demodulate bit mappings from flash memory 401 to other components of system 400. Demapper 402 is optional, and, when omitted, noise calculation unit 403 may directly receive data from flash memory 401. Alternatively, noise calculation unit 403 may be integrated with decoder 404 or other component of system 400. Decoder 404 may be used to decode the data before sending it to controller 405.

Noise Calculation Unit 403 may be configured with the previously described algorithm to calculate the previously described probability characteristics for each bit, with adjustment according to the level programmed, data endurance and retention, and the like, and then assign a different log likelihood ratio for different error events. By considering the noise variations at each programming level, the estimation of data may be optimized and the subject technology produces probabilities that are more reliable than a system that may treat each level equally. Accordingly, the subject technology may be used in both page-based and level based systems (TCM).

The internal components (for example, processor, internal memory, and the like) for demapper 402, noise calculation unit 403, decoder 404, and controller 405 are described herein for convenience as one device, with specific reference to noise calculation unit 403. However, one skilled in the art will recognize that these devices may be separate elements on their own PC boards, and each may include many similar internal hardware components. Accordingly, it is the intention that any one of these devices (for example, noise calculation unit 403 and controller 405) may be described in a same or similar manner and/or perform the same or similar logic and/or functionality. For example, demapper 402 and/or decoder 404 may also be responsible for determining and applying the previously described log likelihood ratios.

Noise Calculation Unit 403 may include several internal components (not shown) such as a read-only memory, a flash component interface (for example, a multiplexer to manage instruction and data transport along a serial connection to flash memory 401), an I/O interface, error correction circuitry, and the like. In some aspects, all of these internal elements of Noise Calculation Unit 403 may be integrated into a single chip. In other aspects, these elements may be separated on their own PC board. Noise Calculation Unit 403 may include a processor configured to execute code or instructions to perform the operations and functionality described herein, including implementing the previously described algorithm. In other aspects, a separate processor (for example, a processor of controller 405) may be responsible for executing the same. The processor may be configured to monitor and/or control the operation of the components in Noise Calculation Unit 403. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within Noise Calculation Unit 403 and/or its processor. One or more sequences of instructions may be software stored and read from a storage medium (for example, storage medium 407), flash memory 401, or received from a host device (for example, from host 407 via a host interface 408). ROM, storage medium 407, and flash memory 401 represent some examples of machine or computer readable media on which instructions/code executable by Noise Calculation Unit 403 and/or its processor may be stored. Machine or computer readable media may generally refer to any medium or media used to provide instructions to Noise Calculation Unit 403 and/or its processor, including volatile media, such as dynamic memory used for storage media 102 or for buffers within Noise Calculation Unit 403, and non-volatile media, such as electronic media, optical media, and magnetic media.

In one aspect, controller 405 may be configured to store data received from a host device 407 in flash memory 401 in response to a write command from host device 407. Controller 405 may be further configured to read data stored in flash memory 401 and to transfer the read data to Noise Calculation Unit 403 and then ultimately to host device 407 in response to a read command from host device 407. Host device 407 may represent any device configured to be coupled to data storage system 400 and configured to store data in system 400. Host device 407 may be a computing system such as a personal computer, a server, a workstation, a laptop computer, PDA, smart phone, and the like. Alternatively, host device 407 may be an electronic device such as a digital camera, a digital audio player, a digital video recorder, and the like.

Host interface 408 may be integrated with system 400 and configured to be operably coupled (for example, by wired or wireless connection) to host device 407, to receive data from host device 407 and to send data to host device 407. Host interface 407 may include electrical and physical connections, or a wireless connection, for operably coupling host device 407 to controller 405 (for example, via the I/O interface of controller 405). Host interface 408 may be configured to communicate data, addresses, and control signals between host device 407 and controller 405. Alternatively, the I/O interface of controller 405 may include and/or be combined with host interface 408. Host interface 408 may be configured to implement a standard interface, such as Serial-Attached SCSI (SAS), Fiber Channel interface, PCI Express (PCIe), SATA, USB, and the like. Host interface 408 may be configured to implement only one interface. Alternatively, host interface 408 (and/or the I/O interface of controller 405) may be configured to implement multiple interfaces, which may be individually selectable using a configuration parameter selected by a user or programmed at the time of assembly. Host interface 408 may include one or more buffers for buffering transmissions between host device 409 and controller 405.

In some aspects, storage medium 407 represents volatile memory used to temporarily store data and information used to manage data storage system 400. According to one aspect of the subject technology, storage medium 407 is random access memory (RAM) such as double data rate (DDR)

RAM. Other types of RAM also may be used to implement storage medium 407. Memory 407 may be implemented using a single RAM module or multiple RAM modules. While storage medium 407 is depicted as being distinct from Noise Calculation Unit 403 and controller 405, those skilled in the art will recognize that storage medium 407 may be incorporated into Noise Calculation Unit 403 and/or controller 405 without departing from the scope of the subject technology. Alternatively, storage medium 407 may be a non-volatile memory such as a magnetic disk, flash memory, peripheral SSD, and the like.

Flash memory 401 represents a non-volatile memory device for storing data. According to one aspect of the subject technology, flash memory 401 includes, for example, a NAND flash memory. Flash memory 401 may include a single flash memory device or chip, or may include multiple flash memory devices or chips arranged in multiple channels. Flash memory 401 is not limited to any particular capacity or configuration. For example, the number of physical blocks, the number of physical pages per physical block, the number of sectors per physical page, and the size of the sectors may vary within the scope of the subject technology.

Flash memory may have a standard interface specification. This standard ensures that chips from multiple manufacturers can be used interchangeably (at least to a large degree). The interface hides the inner working of the flash and returns only internally detected bit values for data. In one aspect, the interface of flash memory 401 is used to access one or more internal registers 409 and an internal flash controller 410 for communication by external devices. In some aspects, registers 409 may include address, command, and/or data registers, which internally retrieve and output the necessary data to and from a NAND memory cell array 411. For example, a data register may include data to be stored in memory array 411, or data after a fetch from memory array 411, and may also be used for temporary data storage and/or act like a buffer. An address register may store the memory address from which data will be fetched to host 407 or the address to which data will be sent and stored. In some aspects, a command register is included to control parity, interrupt control, and the like. In some aspects, internal flash controller 410 is accessible via a control register to control the general behavior of flash memory 401. Internal flash controller 410 and/or the control registers 409 may control the number of stop bits, word length, receiver clock source, and may also control switching the addressing mode, paging control, coprocessor control, and the like.

In some aspects, registers 409 may also include a test register. The test register may be accessed by specific addresses and/or data combinations provided at the interface of flash memory 401 (for example, by specialized software provided by the manufacturer to perform various tests on the internal components of the flash memory). In further aspects, the test register may be used to access and/or modify other internal registers, for example the command and/or control registers. In some aspects, test modes accessible via the test register may be used to read, input or modify certain programming conditions of flash memory 401 (for example, determine read levels) to dynamically vary how data is read from the memory cells of memory arrays 412.

It should be understood that in all cases data may not always be the result of a command received from host 407 and/or returned to host 407. In some aspects, Noise Calculation Unit 403 and/or controller 405 may be configured to execute a read operation independent of host 407. The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (for example, his) include the feminine and neuter gender (for example, her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations.

An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A computer implemented method of determining a probability that a memory cell was programmed to an input level, comprising:
    receiving an output level read from a memory cell;
    for each of a plurality of programming levels, determining a probability that the programming level corresponds to the output level, the probability based on a variance determined by a relative position of the output level with respect to a mean value of a distribution corresponding to the programming level;
    generating a probability value from the plurality of determined probabilities; and
    providing the probability value for use at a demodulator.

2. The computer implemented method of claim 1, wherein, for each of a plurality of programming levels, the probability is a function of the output level and the mean value corresponding to the programming level.

3. The computer implemented method of claim 1, wherein the variance of each distribution above the output level is of cell levels less than a mean of the distribution, and wherein the variance of each distribution below the output level is of cell levels greater than a mean of the distribution.

4. The computer implemented method of claim 3, comprising:
    determining a first, second, third, and fourth probability that the output level corresponds to a variance of a first, second, third, and fourth distribution, respectively,
    wherein the variance of the first and fourth distributions are not determined by the relative position of the output level with respect to the mean value of the first and fourth distributions.

5. The computer implemented method of claim 4, wherein the probability value includes a log domain probability of a least significant bit and a log domain probability of a most significant bit.

6. The computer implemented method of claim 5, wherein the log domain probability of the least significant bit includes a ratio of the sum of the first and second probability to the sum of the third and fourth probability, and wherein the log domain probability of the most significant bit includes a ratio of the sum of the first and third probability to the sum of the second and fourth probability.

7. The computer implemented method of claim 1, wherein the probability being based on a variance includes the probability being based on a standard deviation.

8. The computer implemented method of claim 1, wherein the mean value of the distribution corresponding to the programming level is a value of the programming level.

9. The computer implemented method of claim 1, comprising:
    determining the mean value and variance of each of the plurality of programming levels based on a cycle time associated with the memory cell.

10. The computer implemented method of claim 1, comprising:
    determining the mean value and variance of each of the plurality of programming levels based on a retention time associated with the memory cell.

11. A computer implemented method of determining a probability that a memory cell was programmed to a certain input level, comprising:
    receiving an output level read from a memory cell;
    for each of a plurality of programming levels, each having a unique distribution, determining a probability that the programming level corresponds to the output level, the probability determined as a function of the output level, a mean value of a distribution corresponding to the programming level, and a variance from the mean value;
    generating a probability value from a function of the plurality of probabilities; and
    providing the probability value for use at a demodulator.

12. The computer implemented method of claim 11, wherein the variance is determined by a relative position of the output level with respect to the mean value.

13. The computer implemented method of claim 12, wherein, for each of the plurality of programming levels, if the distribution corresponding to the programming level is above the output level then the variance is below the mean value, and if the distribution is below the output level then the variance is above the mean value.

14. The computer implemented method of claim 12, comprising:
    determining a first, second, third, and fourth probability that the output level corresponds to a variance of a first, second, third, and fourth distribution, respectively,
    wherein the variance of the first and fourth distributions are not determined by the relative position of the output level with respect to the mean value.

15. The computer implemented method of claim 14, wherein the probability value includes a log domain probability of a least significant bit and a log domain probability of a most significant bit.

16. The computer implemented method of claim 15, wherein the log domain probability of the least significant bit includes a ratio of the sum of the first and second probability to the sum of the third and fourth probability, and wherein the log domain probability of the most significant bit includes a ratio of the sum of the first and third probability to the sum of the second and fourth probability.

17. The computer implemented method of claim 11, wherein the probability being based on a variance includes the probability being based on a standard deviation.

18. The computer implemented method of claim 11, wherein the mean value of the distribution corresponding to the programming level is a value of the programming level.

19. The computer implemented method of claim 11, comprising:
  determining the mean value and variance of each of the plurality of programming levels based on a cycle time associated with the memory cell.

20. The computer implemented method of claim 11, comprising:
  determining the mean value and variance of each of the plurality of programming levels based on a retention time associated with the memory cell.

21. A system for determining a probability that a memory cell was programmed to a certain input level, comprising:
  a memory interface configured to be operably coupled to a memory circuit;
  a demodulator;
  a memory, the memory having stored thereon a plurality of programming levels and corresponding unique level distributions; and
  a logic unit, wherein the logic unit is configured to:
    receive an output level read from a memory cell;
    for each of the plurality of programming levels, determine a probability that the programming level corresponds to the output level, the probability determined as a function of the output level, a mean value of a respective corresponding unique level distribution, and a variance from the mean value;
    determine a log domain probability value from a function of the plurality of probabilities; and
    provide the log domain probability value for use at the demodulator in connection with other log domain probability values provided by the logic unit.

22. The system of claim 21, wherein the variance is determined by a relative position of the output level with respect to the mean value.

23. The system of claim 22, wherein, for each of the plurality of programming levels, if the distribution corresponding to the programming level is above the output level then the variance is below the mean value, and if the distribution is below the output level then the variance is above the mean value.

24. The system of claim 21, wherein the probability being based on a variance includes the probability being based on a standard deviation.

* * * * *